(12) United States Patent
Decker et al.

(10) Patent No.: US 9,756,717 B2
(45) Date of Patent: Sep. 5, 2017

(54) ELECTRONIC, OPTOELECTRONIC, OR ELECTRIC ARRANGEMENT

(71) Applicant: CONTINENTAL AUTOMOTIVE GMBH, Hannover (DE)

(72) Inventors: Michael Decker, Regensburg (DE); Thomas Riepl, Bad Abbach (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 14/772,557

(22) PCT Filed: Feb. 20, 2014

(86) PCT No.: PCT/EP2014/053279
§ 371 (c)(1),
(2) Date: Sep. 3, 2015

(87) PCT Pub. No.: WO2014/135373
PCT Pub. Date: Sep. 12, 2014

(65) Prior Publication Data
US 2016/0021730 A1    Jan. 21, 2016

(30) Foreign Application Priority Data

Mar. 7, 2013 (DE) ................ 10 2013 203 932

(51) Int. Cl.
*H05K 1/02* (2006.01)
*H05K 1/05* (2006.01)
*H05K 1/18* (2006.01)

(52) U.S. Cl.
CPC ......... *H05K 1/0203* (2013.01); *H05K 1/0207* (2013.01); *H05K 1/18* (2013.01); *H01L 2224/48091* (2013.01); *H01L 2224/48227* (2013.01); *H05K 1/021* (2013.01); *H05K 1/0204* (2013.01); *H05K 1/0206* (2013.01); *H05K 1/0209* (2013.01); *H05K 1/056* (2013.01);
(Continued)

(58) Field of Classification Search
CPC .... H05K 1/021; H05K 1/0203; H05K 1/0206; H05K 1/0207; H05K 1/0212; H05K 1/188
USPC ........................................ 361/761
See application file for complete search history.

(56) References Cited

U.S. PATENT DOCUMENTS 5,473,510 A    12/1995    Dozier, II
5,991,162 A    11/1999    Saso
(Continued)

FOREIGN PATENT DOCUMENTS

DE    19528632 A1    2/1997
DE    10214311 A1    10/2003
(Continued)

*Primary Examiner* — Tuan T Dinh
*Assistant Examiner* — Mukund G Patel
(74) *Attorney, Agent, or Firm* — Laurence A. Greenberg; Werner H. Stemer; Ralph E. Locher (57) ABSTRACT

An electronic, optoelectronic or electric arrangement contains a circuit carrier having a metallic heat conductor, and a component, which is embedded, inserted or formed in the circuit carrier. The component has at least one electric, electronic or optoelectronic construction element and a rewiring layer, which contains a metallic heat conducting path. A metallic-thermal connection of the rewiring layer and the metallic heat conducting layer of the circuit carrier is provided by the heat conducting path.

13 Claims, 3 Drawing Sheets

(52) U.S. Cl.
 CPC ....... *H05K 1/185* (2013.01); *H05K 2201/066* (2013.01); *H05K 2201/10166* (2013.01); *H05K 2201/10303* (2013.01); *H05K 2201/10409* (2013.01)

(56) References Cited

U.S. PATENT DOCUMENTS

| | | |
|---|---|---|
| 6,084,776 A | 7/2000 | Cuntz et al. |
| 8,076,586 B2 | 12/2011 | Tuominen et al. |
| 9,063,307 B2 | 6/2015 | Yabre et al. |
| 2007/0227761 A1 | 10/2007 | Tuominen et al. |
| 2008/0315396 A1* | 12/2008 | Kuhlman ............ H01L 23/3121 257/692 |
| 2009/0296349 A1 | 12/2009 | Suzuki |
| 2010/0254093 A1* | 10/2010 | Oota .................. B60R 16/0239 361/720 |
| 2013/0021769 A1 | 1/2013 | Fukuzono |

FOREIGN PATENT DOCUMENTS

| | | |
|---|---|---|
| DE | 102005063281 A1 | 7/2007 |
| DE | 102009027530 A1 | 1/2011 |
| DE | 102010043077 A1 | 11/2011 |
| EP | 1280392 A1 | 1/2003 |
| EP | 2555238 A1 | 2/2013 |
| WO | 2012076986 A1 | 6/2012 |

\* cited by examiner

ELECTRONIC, OPTOELECTRONIC, OR ELECTRIC ARRANGEMENT

BACKGROUND OF THE INVENTION

Field of the Invention

The invention relates to an electronic, optoelectronic, or electrical arrangement having a circuit carrier and having a component embedded, inserted, or formed in the circuit carrier. Furthermore, the invention relates to an electronic, optoelectronic, or electrical device or module, having an arrangement according to the invention.

The trends in the field of electronics, optoelectronics, and electrics are going toward ever smaller and more compact entities. This is achieved, inter alia, in that a passive electronic or electrical structural element arranged on a printed circuit board, for example, is replaced by a structural element integrated in the printed circuit board. If one only considers passive structural elements, these thus require on average approximately 50% of a surface of a printed circuit board, whereby surface installation space can be saved by integration of structural elements in the printed circuit board. Such structural elements integrated into the printed circuit board are referred to as embedded components. Comparatively short electrical connection structures and optimization of a signal integrity result due to embedded components.

The technology of the embedded components is used to increase a packing density of an electronic, optoelectronic, or electrical arrangement. Non-housed structural elements, for example, semiconductor structural elements, are preferably used in this case. Therefore, possibilities for improving or optimizing heat paths which can be used, for example, in the case of an SMD mounting of a structural element (surface-mounted device), are dispensed with. These are, for example, diffusing heat through a metal block (heat slug) as part of the structural element or improving a thermal conductivity in a z direction, for example, of a printed circuit board, i.e., orthogonally to a comparatively large-area side of the printed circuit board, by providing so-called thermal vias.

Heretofore, only thermally noncritical, for example, passive components have been embedded. Heat dissipation, in particular passive cooling, is based in this case on a principle of heat diffusion in the printed circuit board. However, heat dissipation is limited in its capacity, since a relevant heat path is interrupted again and again by insulators required for electronic or electrical functions. For example, US 2009/0296349 A1 discloses such embedded components, which are provided directly inside a multilayered printed circuit board in an electrically contacting manner on the inner conductor tracks thereof. A heat path from the relevant embedded component to an effective heat sink is interrupted by an electrical and therefore also thermal insulation layer.

BRIEF SUMMARY OF THE INVENTION

It is an object of the invention to specify an improved electronic, optoelectronic, or electrical arrangement (entity) having a circuit carrier and an electronic, optoelectronic, or electrical component. According to the invention, a thermal connection of the component inside the circuit carrier is to be improved.

The object of the invention is achieved by means of an electronic, optoelectronic, or electrical arrangement as claimed in claim 1. Advantageous refinements, additional features, and/or advantages of the invention result from the dependent claims and the following description of the invention.

The electronic, optoelectronic, or electrical arrangement has a circuit carrier which contains a metallic heat conducting means. In addition, the arrangement has a component which is embedded, inserted, or formed in the circuit carrier. The component has at least one electrical, electronic, or optoelectronic structural element. In one embodiment, the component has a plurality of active and/or passive electrical, electronic, or optoelectronic structural elements. In addition, the component has a rewiring layer, which contains a metallic heat conducting path.

A metallic-thermal connection of the rewiring layer to the metallic heat conducting means of the circuit carrier is established by means of the heat conducting path. In particular by means of a heat passage path, which contains the heat conducting path of the rewiring layer, a metallic-thermal connection of the component to the metallic heat conducting means of the circuit carrier and/or to the heat sink is established.

According to the invention, a particularly good thermal connection of the component is achievable inside the circuit carrier. In this way, thermal peak loads can be handled particularly well. The arrangement according to the invention advantageously enables active components to be embedded or inserted or formed in the circuit carrier. For example, surface installation space on the comparatively large-area sides of the circuit carrier can therefore be saved, to increase a packing density and/or to shrink the circuit carrier.

The rewiring layer is particularly designed for the electrical contacting of the structural element or the structural elements by means of the electrical terminal devices thereof—for example, terminal surfaces, terminal pins, or bond wires.

In particular, the rewiring layer has first electrical terminals, which are provided for contacting the electrical terminal devices of the structural element or the structural elements. In a top view of the rewiring layer, the first electrical terminals and the electrical terminal devices of the structural element/the structural elements in particular overlap at least at points. The rewiring layer advantageously has second electrical terminals, by means of which it is electrically connected to the circuit carrier. In an advantageous refinement, every second electrical terminal is wired to a first electrical terminal, i.e., connected in an electrically conductive manner. The spacings of adjacent first electrical terminals are smaller than the spacings of the second electrical terminals. The rewiring layer is thus in particular designed to enlarge a spacing dimension (the so-called "pitch") of the electrical terminals for the connection to the circuit carrier. Such a rewiring layer can also be referred to as an "interposer". For example, the first electrical terminals have a spacing dimension ("pitch") of approximately 100 μm and the second electrical terminals have a spacing dimension between 200 μm and 300 μm.

The electrical contacting of the structural element or structural elements using the rewiring layer is performed in one embodiment by means of a plurality of wiring levels of the rewiring layer which are arranged one on top of another, i.e., this rewiring layer can be designed as multilayered.

The component is embedded or formed completely inside the circuit carrier in one embodiment. In another embodiment, the component is only partially inserted in the circuit carrier or partially formed therein. In this embodiment, a portion of the component is externally visible on the circuit carrier and in particular protrudes beyond the circuit carrier.

The terminology used to explain the invention is based on the terminology which is conventional in the field of heat transmission, according to which at least one thermal connection in series of a heat conducting path (heat conducting procedure) and a heat transfer path (heat transfer procedure) etc. or vice versa is referred to as a heat passage path (heat passage). The term heat path forms a material concept for the functional procedures during heat transfer in this case. In the case of heat conduction, a cross section or volume of the relevant material is substantially responsible for a quantity of heat to be transported. Corresponding to this, a heat conducting path can be a heat path for removing heat inside a specific material, for example, a metal layer or a conductor track, from a warmer location to a colder location, wherein the heat conducting path has an integral formation in particular, in the sense of monolithic (see below).

In a heat transfer path, heat passes from one part or material via a boundary (optionally materially one-piece, non-integral formation) or one or two interfaces (contact resistance) into a second part or material. In this case, the materials can be of the same type and/or composition. A boundary can also be a significant change of the areas participating in the heat transfer procedure. Accordingly, a heat passage path is composed of at least one heat conducting path and at least one heat transfer path. In this case, a heat passage resistance, i.e., a heat transfer resistance and if possible also a heat conducting resistance of the participating parts and/or materials, is to be comparatively small.

According to one embodiment, the arrangement additionally has a heat sink. A metallic-thermal connection of the rewiring layer of the component to the heat sink, which is continuous in particular, is established by means of the heat conducting path in this case. In this case, the connection is produced in particular via the metallic heat conducting means of the circuit carrier.

In embodiments of the invention, the component has a metallic heat conducting path (heat path) of the heat passage path (heat path) in an edge region. In particular, a region of the metallic heat conducting path of the rewiring layer extends laterally from the structural element or the structural elements toward the metallic heat conducting means of the circuit carrier. The heat conducting path can ensure an optionally direct thermal connection to the heat conducting means in this manner. The connection is preferably produced via an inner wall of a passage opening in the heat conducting path or in the interposer.

The region of the metallic heat conducting path of the rewiring layer, which extends laterally from the structural element or the structural elements toward the metallic heat conducting means of the circuit carrier, in particular has at least half as large a transverse dimension as the structural element or one of the structural elements. In this manner, particularly efficient heat diffusion is achievable.

In one embodiment, the rewiring layer has a carrier substrate. The heat conducting path has, for example, a metal layer, in particular a metal track, which is formed on a main surface of the carrier substrate. The metal layer is preferably arranged laterally from the structural element or the structural elements at least at points. In this case, the rewiring layer can have a plurality of metal layers or metal tracks. For example, the rewiring layer has a second metal layer, which is formed on the carrier substrate on a side opposite to the main surface and is metallically-thermally connected to the metal layer formed on the main surface by means of at least one thermal through contact through the carrier substrate.

In one embodiment, the heat conducting path of the rewiring layer does not have any intended electrical or electronic task. Alternatively, the heat conducting path can also fulfill an electrical or electronic task, for example, it can be formed as a ground path. In both cases, the heat conducting path is designed in particular as a lateral heat conducting path with respect to the component.

In further embodiments of the arrangement, the circuit carrier has a in particular metallic—sleeve (heat conducting means) in the passage opening. The sleeve is preferably formed directly adjoining the heat conducting path. In this case, a heat transfer procedure (heat transfer path) can take place between the heat conducting path of the rewiring layer and the sleeve, wherein the sleeve itself functions as a heat conducting path. The sleeve ensures an optionally direct thermal connection to the heat conducting means, wherein the connection preferably occurs through an inner wall of the sleeve. The sleeve can be designed as a galvanically deposited or pressed-in sleeve of the circuit carrier. In this case, the sleeve can be formed materially in one piece with the heat conducting path. For example, the passage opening can extend through the rewiring layer and the sleeve can be deposited in the passage opening and therefore also on the rewiring layer.

The rewiring layer can have one or a plurality of metallic-thermal through contacts in a region, for example, below and/or above and also laterally from the structural element or the structural elements, the passage opening, the sleeve, and/or the heat conducting means. For example, the through contacts are arranged in a mounting region of the structural element/the structural elements, so that the structural element or the structural elements in particular overlap the through contacts in a top view of the rewiring layer.

The rewiring layer is preferably formed separately, in one part, and/or in one piece. However, it is also fundamentally possible to form the rewiring layer or a section thereof as a materially one-piece or integral part of a layer or a region of the circuit carrier; the at least one structural element is provided, for example, on the rewiring layer—in particular on the main surface of the carrier substrate—for example, soldered or glued on. The component can be constructed as a preferably, optionally primarily passively cooled inlay.

In further embodiments, the arrangement has a fastening element or an electrical contact device, which is metallic in particular and is thermally coupled to the heat conducting means of the circuit carrier. In particular, the fastening element or the contact device adjoins the heat conducting means. The fastening element can be formed as a screw, a rivet, a pin, a catch device/unit, etc. The electrical contact device can be formed as a contact pin or a contact socket. In this manner, heat dissipation can occur from the circuit carrier via the fastening means or the electrical contact device. A rear side of the circuit carrier or the arrangement is advantageously no longer required for heat dissipation as previously, but rather is available to be equipped with components, parts, or structural elements.

The heat conducting path of the rewiring layer is, in one embodiment, formed thicker in a region adjacent to the structural element/the structural elements and/or in a region adjacent to the heat conducting means than in a region laterally (in each case) adjacent thereto, which is more remote from the structural element(s) or the heat conducting means. The heat sink can be a housing section, a block, in particular a metal block, an electrical line, a cable harness, or a cooling body. Furthermore, the component having the rewiring layer can be formed as a passive or—preferably—active component.

BRIEF DESCRIPTION OF THE SEVERAL VIEWS OF THE DRAWING

The arrangement is explained in greater detail hereafter on the basis of exemplary embodiments with reference to the appended schematic figures. Elements which have an identical, univocal, or similar formation and/or function are identified with the same reference signs in various figures. In the figures.

DESCRIPTION OF THE INVENTION

The invention is explained hereafter in an application on an electronic, optoelectronic, or electrical arrangement 1 for automotive technology. The arrangement 1 can alternatively also be used in the field of power electronics, computer technology, etc. The arrangement 1 can be, for example, an (electronics) module 1 or an assembly 1 in this case, in particular for a control unit of a motor vehicle, such as an engine control unit.

When an integral formation is referred to in the scope of the invention, this does not refer to a merely materially one-piece formation in particular. The term "integral" is to be used here in the sense of "monolithic" or "homogeneous", i.e., in the case of an integral formation, there is no material bond via, for example, a solder point or glue point, but rather in particular a crystalline material bond within the same material section of the same part. For example, by means of a solder point, a materially one-piece formation of two electrical conductors is produced, which is not integrally formed in this case. The two electrical conductors can in turn be integrally formed, of course. In a materially one-piece connection, in contrast to an integral connection, substantially different material concentrations occur.

Figure 2:
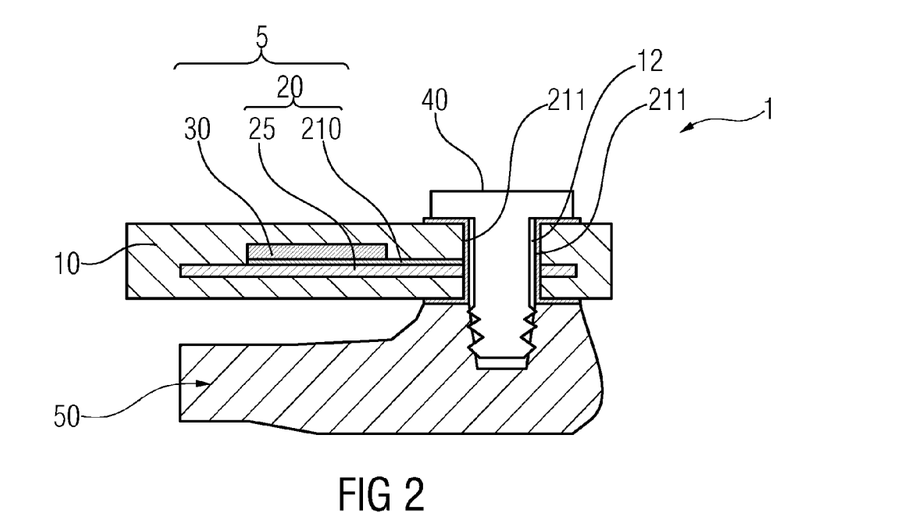
FIG. 2 shows a sectional view of the arrangement according to the first exemplary embodiment.

FIG. 2 shows an electrical, electronic, or optoelectronic arrangement 1 according to a first exemplary embodiment in a schematic cross section. The arrangement 1 has a circuit carrier 10 and a component 5, which is embedded in the circuit carrier 10 or formed in the circuit carrier.

Figure 1:
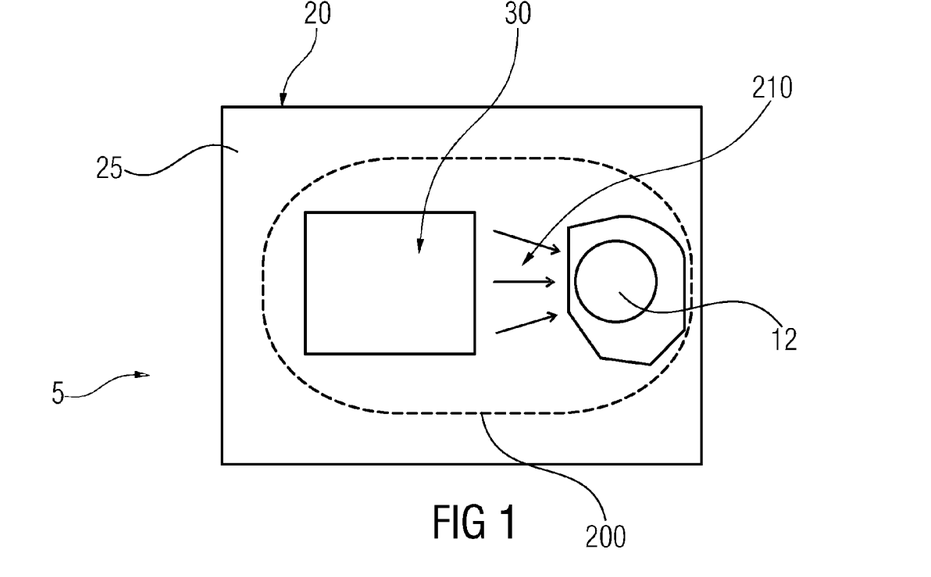
FIG. 1 shows a top view of a component, which is to be embedded or inserted in a circuit carrier and functions as a heat source, for an electrical, optoelectronic, or electrical arrangement according to a first exemplary embodiment.

FIG. 1 shows the component 5, which is to be embedded in the circuit carrier 10 or formed in the circuit carrier 10, of FIG. 2 in a very schematic top view.

The circuit carrier 10 is, for example, a (for example, laminated multilayer) printed circuit board 10. The circuit carrier 10 contains a metallic heat conducting means 211. For example, the heat conducting means 211 is formed by a metallization on a surface of the circuit carrier 10. In the present case, the metallic heat conducting means 211 is a metallic sleeve which is formed in the region of a passage opening 12 (also called "via"), which extends through the circuit carrier 10.

In particular, the sleeve forms an inner wall of the passage opening 12. Alternatively or additionally, for example, it is also conceivable that the metallic heat conducting means 211—or a partial region thereof—is formed by an—in particular adjoining the passage opening 12 or protruding therein—edge region of the metallic heat conducting path 210.

The sleeve preferably has a collar, which extends laterally from the passage opening 12 on a main surface of the circuit carrier 10, and preferably a second collar, which extends laterally from the passage opening 12 on the opposing main surface of the circuit carrier 10. The sleeve is, for example, galvanically deposited or pressed into the circuit carrier 10. It can be formed as a copper plating of the passage opening 12, optionally with the collar or collars. One or both collars are preferably formed materially in one-piece or integrally in this case with the portion of the sleeve 211 arranged inside the passage opening 12.

The component 5 contains a rewiring layer 20 having a carrier substrate 25 made of, for example, silicon, aluminum, copper, glass, polymer, etc. The rewiring layer 20 can be formed in one layer or multiple layers. The carrier substrate 25 is preferably separately manufactured from the circuit carrier 10 and in particular embedded therein. The rewiring layer 20 carries—in particular on a main surface of the carrier substrate 25—an electrical, optoelectronic, or electronic structural element 30. The structural element 30 can be an active or passive structural element 30, for example, a non-housed single layer or multilayer semiconductor part. The structural element 30 functions in an operation of the arrangement 1 as a heat source 30, for example because of heat loss which arises during operation of the structural element 30. The structural element 30 can be designed as a cooled inlay 20, 30.

The structural element 30 is electrically contacted with first electrical terminals 215 (not shown in FIGS. 1 and 2 for simplification) of the rewiring layer 20 by means of electrical terminal devices such as terminal surfaces, terminal pins, terminal legs, or bond wires (not shown in FIGS. 1 and 2 for simplification). The rewiring layer 20 is in turn electrically contacted using second electrical terminals 217 (not shown for simplification in FIGS. 1 and 2) with electrical conductor tracks of the circuit carrier 10 (not shown in FIGS. 1 and 2 for simplification).

In particular in the case of active structural elements 30, a comparatively large amount of heat often results during the operation thereof, which must be removed from the rewiring layer 20 and optionally also from the circuit carrier 10.

Since the component 5 is provided inside the circuit carrier 10, heat dissipation is provided according to the invention to prevent excessively strong heating of the structural element 30 and possibly a section of the component 5 adjacent thereto.

According to the present, first exemplary embodiment, the rewiring layer 20 is embodied such that a region 200 of the rewiring layer 20 which is provided for the thermal connection of a rear side of the structural element 30—consisting of silicon, for example—is guided laterally adjacent to the structural element 30. This region 200 is widened adjacent to the structural element 30 in particular such that it can be thermally contacted in a plane of the circuit carrier 10. The component 5 is positioned in this case in the circuit carrier 10 such that, for example, a borehole 12 extends through the circuit carrier 10 and the rewiring layer 20 extends through the region 200 formed for heat dissipation of the structural element 30. The borehole 12 is embodied, for example, such that the inner wall thereof, i.e., also the region 200, can be indirectly or directly thermally connected by a, for example, mechanical fastening element 40 or an electrical contact device 40 to a heat sink 50 (see below).

In the present exemplary embodiment, the fastening element 40 lies directly on one of the collars of the sleeve, to establish a direct metallic thermal connection between the heat conducting means 211 and the fastening element 40. In particular, a preferably continuous metallic heat path results in this case to the heat sink 50, which ensures comparatively good heat dissipation of the structural element 30. In this case, in particular the mechanical fastening element 40 is used to improve the heat dissipation, i.e., to cool the structural element 30. A capability of resisting a short-term thermal peak load is also improved in particular by the metallic heat path.

The second collar of the sleeve 211 is preferably in direct thermal and in particular mechanical contact with the heat sink 50. A comparatively large part of the heat to be dissipated can be conducted directly through the sleeve 211 and not through the fastening element 40 in this way.

The region 200 is formed in this case by means of a metallic heat conducting path 210 for the heat dissipation of the structural element 30. The metallic heat conducting path 210 is formed, for example, by a metal layer 210, in particular a metal track 210. A materially one-piece connection is preferably formed between the heat conducting path 210 and the—preferably galvanically deposited—sleeve 211. The heat conducting path 210 does not fulfill any intended electrical or electronic task in the present exemplary embodiment.

By means of the heat conducting path 210, (waste) heat generated by the structural element 30 can be transported away from the structural element 30 (coarsely indicated by the arrows 210 in FIG. 1). The rewiring layer 20 is designed in particular such that comparatively good thermal contact is formed between the structural element 30 from which heat is to be dissipated and the heat conducting path 210. This is produced, for example, by a direct and planar connection of the structural element 30 to the heat conducting path 210.

In operation of the arrangement 1, a heat transfer results originating from the structural element 30 to the heat conducting path 210, through which a heat flow caused by the structural element 30 flows to the heat conducting means 211. The heat transfer to the heat conducting path 210 and the heat conducting path 210 form a heat passage path in/on the rewiring layer 20. In this case, the rewiring layer 20 can have a single one or a plurality of such heat passage paths, which are optionally thermally coupled with one another, which again occurs by means of at least one heat passage path, preferably through the rewiring layer 20.

The passage opening 12 is formed in the present exemplary embodiment as a borehole 12 for mechanical fastening of the circuit carrier 10. A preferably metallic fastening element 40 (see FIG. 2) is arranged on the mounting device 12. The fastening element is provided for heat dissipation from the circuit carrier 10 and preferably directly adjoins the heat conducting means 211. In this case, a heat transfer results from the heat conducting path 210 through the heat conducting means 211—in the present case the metallic sleeve in the passage opening 12—through to the fastening element 40.

The fastening element 40 can be formed as a screw 40 (see FIG. 2), a rivet, a pin, a catch device, a catch unit, etc.

The fastening element 40 conducts the heat away from the heat conducting means 211 to a heat sink 50. In this case, the fastening element 40 can be in direct thermal contact with the heat sink 50. For example, it is screwed together with the heat sink 50—as shown as an example in the present exemplary embodiment.

The heat sink 50 is, for example, a block, in particular a metal block (see FIG. 2), which can be, for example, a housing section or a mechanical carrier structure. In particular, the heat sink 50 is designed as a cold reservoir 50 and optionally as a preferably passive cooling body 50, wherein heat generated by the arrangement 1 in operation preferably does not accumulate in the heat sink 50 or only accumulates up to a certain degree, which ensures sufficient heat dissipation of the structural element 30. Alternatively, the heat sink can have active cooling.

Figure 3:
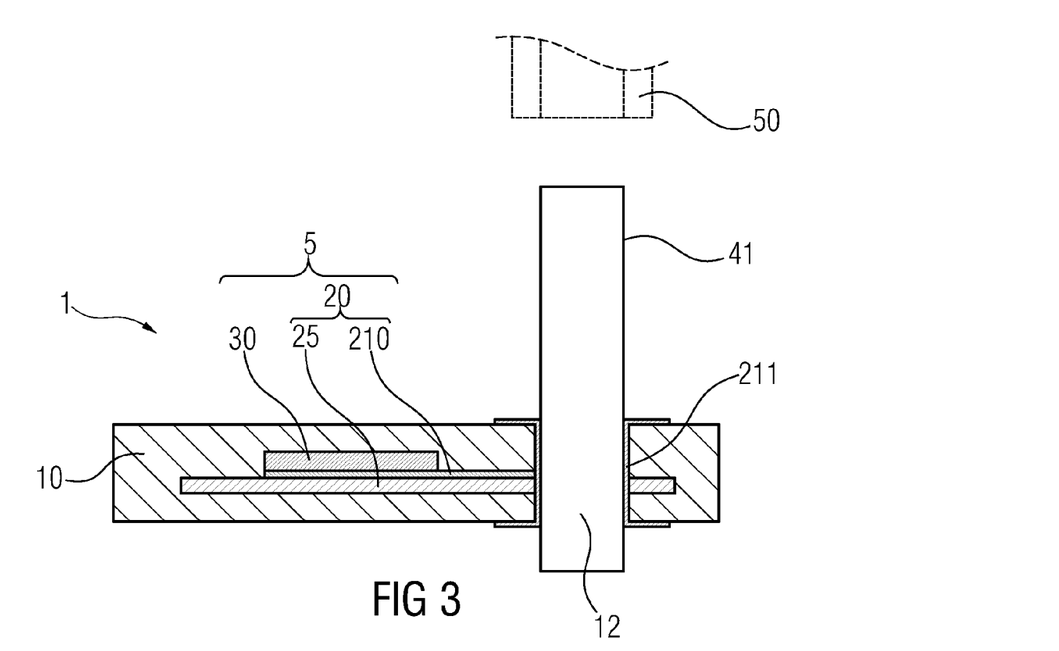
FIG. 3 shows a sectional view similar to FIG. 2 of an electrical, optoelectronic, or electrical arrangement according to a second exemplary embodiment.

FIG. 3 shows a second exemplary embodiment of an electrical, electronic, or optoelectronic arrangement 1.

The arrangement 1 according to the second exemplary embodiment differs from that of the first exemplary embodiment in that an electrical contact device 41 for dissipating heat from the circuit carrier 10 is provided in the passage opening 12. The electrical contact device 41 can be, for example, a contact pin (see FIG. 3) or a contact socket. Furthermore, the contact device 41 can be a plug device, which can be designed as a pin or socket plug device or as a hermaphrodite. Like the fastening element 40 of the first exemplary embodiment, the electrical contact device adjoins the heat conducting means 211 formed as a sleeve in the passage opening 12, but on the inner wall of the sleeve arranged in the passage opening 12, in contrast to the first exemplary embodiment. Alternatively or additionally, it is also conceivable that the electrical contact device adjoins the collar of the sleeve. Instead of the passage opening 12, the circuit carrier 10 can also have a solder pad or the like for fastening the electrical contact device 41.

For example, an electrical terminal device of the structural element 30, for example, an electrical terminal surface or an electrical terminal pin, is connected in an electrically conductive manner to the electrical contact device 41 via the heat conducting path 210 of the rewiring layer 20. The electrical contact device 41 can represent a signal terminal or a ground terminal in this case.

Furthermore, the arrangement 1 according to the second exemplary embodiment differs from that of the first exemplary embodiment in that an electrical line 50 is provided as a heat sink 50, the electrical terminal element of which not only electrically but also thermally contacts the electrical contact device 41. In an advantageous refinement, the arrangement has a plurality of electrical contact devices 41 and the heat sink is formed by a cable harness having a plurality of electrical lines 50, which each electrically and thermally contact one of the electrical contact devices 41.

Figure 4:
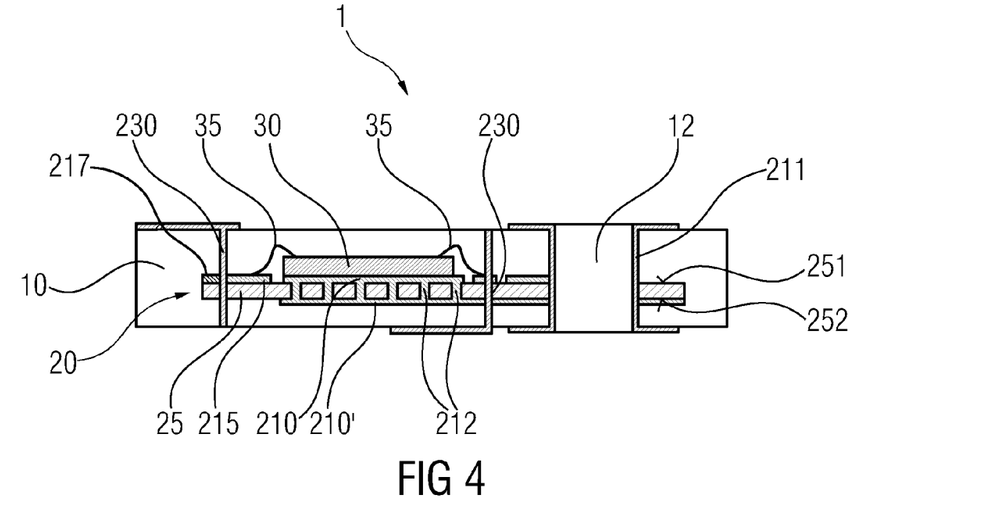
FIG. 4 shows a sectional view, again similar to FIG. 2, of an electrical, optoelectronic, or electrical arrangement according to a third exemplary embodiment.

FIG. 4 shows a schematic cross section of an electrical, electronic, or optoelectronic arrangement 1 according to a third exemplary embodiment. The rewiring layer 20 is designed as multilayered in the present exemplary embodiment, in contrast to the first two exemplary embodiments. Metallic heat conducting paths 210, 210' are provided on the two comparatively large-area outer sides. In the present case, a metallic heat conducting path 210 is arranged on a main surface 251 of the carrier substrate 25 of the rewiring layer 20, which carries the structural element 30. A second metallic heat conducting path 210' is arranged on a second main surface 252 of the carrier substrate opposite to this main surface 251. In a refinement, a metallic heat conducting path 210 can be arranged inside the carrier substrate 25 (not shown in the figures).

One or a plurality of thermal through contacts 212 is provided between the metallic heat conducting path 210 and the second metallic heat conducting path 210'. The thermal through contacts 212 extend in particular from the first main surface 251 through the carrier substrate 25 to the second main surface 252. For example, the thermal through contacts 212 are formed by metal-filled vias of the carrier substrate 25. A plurality of through contacts 212 is preferably provided in this case in the mounting region of the structural element 30.

The multilayered structure of the rewiring layer 20 enables different surfaces and optionally layers, on/in which the heat paths 210 are arranged, to be implemented without having to accept worsening of heat removal.

The structural element 30 according to the third exemplary embodiment has electrical terminal devices formed as bond wires 35. The bond wires 35 are connected to the first electrical terminals 215 of the rewiring layer 20. Second electrical terminals 217 of the rewiring layer 20 are wired in an electrically conductive manner with the first electrical terminals 215 by means of conductor tracks of the rewiring layer 20 and are electrically connected to the circuit carrier 10 by means of signal contacts 230. The first electrical terminals 215 have, for example, a spacing dimension of approximately 100 µm and the second electrical terminals 217 have a spacing dimension between 200 µm and 300 µm, wherein the limits are included. The signal contacts 230 of the circuit carrier 10 are designed, for example, as metal-filled vias and each merge into a conductor track, which extends at least at points on a main surface of the circuit carrier 10.

Figure 5A:
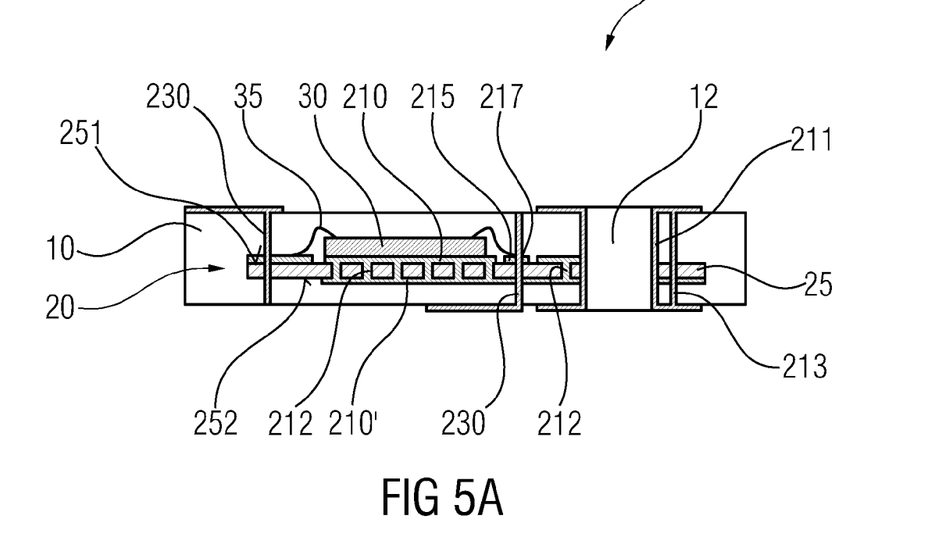
FIG. 5A shows a sectional view, also similar to FIG. 2, of an electrical, optoelectronic, or electrical arrangement according to a fourth exemplary embodiment.
Figure 5B:
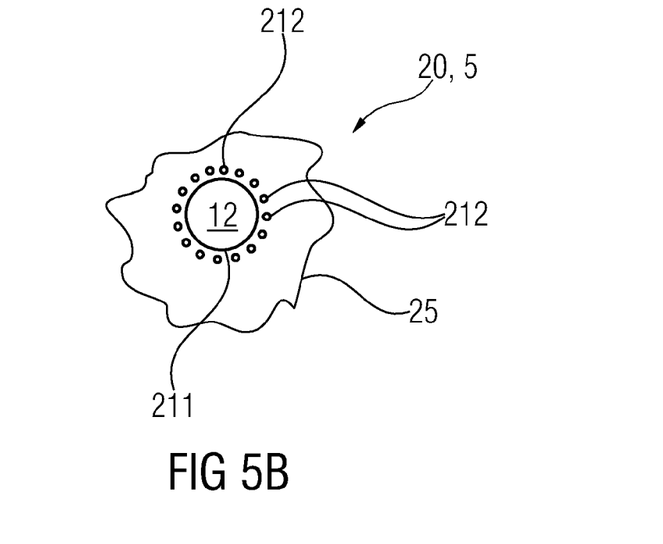
FIG. 5B shows a top view of a detail of the arrangement according to the exemplary embodiment of FIG. 5A.

FIG. 5A shows an electrical, electronic, or optoelectronic arrangement 1 according to a fourth exemplary embodiment in a schematic cross section. FIG. 5B shows a detail of the component 5 of the arrangement 1 according to FIG. 5A in a schematic top view.

The arrangement according to the fourth exemplary embodiment essentially corresponds to that of the third exemplary embodiment. In addition, however, the rewiring layer 20 is provided in the region of the sleeve 211 with a plurality of preferably metallic through contacts 212, which in particular adjoin at least one of the metallic heat conducting paths 210, 210' of the rewiring layer and extend through the carrier substrate 25. The through contacts 212 are in the form of a collar on the rewiring layer in a top view, for example, and are preferably distributed at regular intervals around the passage opening 12 and in particular overlap with the collar or collars of the sleeve 211.

The through contact 212 through the rewiring layer 20, which is arranged in the region of the heat conducting means 211 formed by the sleeve, or a subset of these through contacts 212 can represent parts of—in particular metallic—through contacts 213 through the circuit carrier 10. The through contacts 213 through the circuit carrier 10 in particular connect two collars of the sleeve 211, which are arranged on opposite sides of the circuit carrier 10, to one another in a thermal manner. These through contacts 213 also penetrate one or a plurality of heat conducting paths 210, 210' of the rewiring layer 20 and extend through the carrier substrate 25.

In all exemplary embodiments and designs of the arrangement 1, the heat conducting path 210 can optionally be formed with a greater thickness than further conductor tracks of the rewiring layer 20, which are not designed for heat dissipation to the heat conducting means 211. In this manner, the heat diffusion can be further improved and/or a heat buffer can optionally be formed directly on the structural element 30, which is advantageous, for example, for transient load states. In a refinement, the heat conducting path 210 is formed thinner in a middle region between the structural element 30 and the heat conducting means 211 than in one or both end sections (regions at the structural element 30 and/or at the heat conducting means 211).

The invention claimed is:

1. A configuration selected from the group consisting of an electronic configuration, an optoelectronic configuration, and an electrical configuration, the configuration comprising:
   a circuit carrier having a metallic heat conductor; and
   a component embedded or inserted in said circuit carrier, said component having a rewiring layer and at least one structural element selected from the group consisting of an electrical structural element, an electronic structural element and an optoelectronic structural element, said structural element having electrical terminal devices and said rewiring layer configured to enlarge a spacing dimension of said electrical terminal devices for a connection to said circuit carrier, said rewiring layer having a carrier substrate and a metallic heat conducting path, said metallic heat conducting path having a metal track formed on a first main surface of said carrier substrate, and said metallic heat conducting path establishing a metallic-thermal connection of said rewiring layer to said metallic heat conductor of said circuit carrier;
   wherein said circuit carrier has a passage opening formed therein, which extends through said carrier substrate;
   wherein said metallic heat conductor, or at least a subregion thereof, is formed by an inner wall defining said passage opening; and
   wherein said heat conductor is formed by a metallic sleeve inserted into said passage opening.

2. The configuration according to claim 1, wherein said circuit carrier is a laminated multilayer printed circuit board and said carrier substrate is formed from silicon, aluminum, copper, glass, or a polymer separately from said circuit carrier.

3. The configuration according to claim 1, wherein:
   said rewiring layer has first electrical terminals provided for contacting said electrical terminal devices of said structural element and which overlap with said electrical terminal devices in a top view of said carrier substrate; and
   said rewiring layer has second electrical terminals, by which said rewiring layer is connected to said circuit carrier.

4. The configuration according to claim 1, further comprising a heat sink, wherein a metallic-thermal connection of said rewiring layer to said heat sink is established by means of said metallic heat conducting path.

5. The configuration according to claim 1, wherein a region of said metallic heat conducting path extends laterally from said structural element toward said metallic heat conductor.

6. The configuration according to claim 5, wherein said region has a transverse dimension that is at least half as large a transverse dimension as said structural element.

7. The configuration according to claim 1, wherein said metal track is disposed laterally from said structural element at least at points.

8. The configuration according to claim 1, wherein:
said rewiring layer has a metal layer, which is disposed on a second main surface of said carrier substrate opposite to said first main surface; and
said metal track is metallically-thermally connected to said metal layer by at least one thermal through contact through said carrier substrate.

9. The configuration according to claim 8, wherein said rewiring layer has at least one metallic-thermal through contact, which extends from said metal track to said metal layer through said carrier substrate, in a mounting region of said structural element and/or said metallic heat conductor.

10. The configuration according to claim 1, further comprising through contacts disposed through said circuit carrier, said through contacts connecting parts of said metallic heat conductor disposed on opposite sides of said circuit carrier to one another and extend through said carrier substrate and said metal track.

11. The configuration according to claim 1, wherein said metallic heat conducting path is formed thicker in a region adjacent to said structural element and/or in a region adjacent to said metallic heat conductor than in a region laterally adjacent thereto.

12. The configuration according to claim 1, further comprising a mechanical fastening element or an electrical contact device, which is thermally coupled to said metallic heat conductor.

13. The configuration according to claim 1, wherein said metallic heat conducting path does not fulfill any intended electrical or electronic task or is formed as an electrical ground path.

* * * * *